United States Patent
Fan et al.

(10) Patent No.: US 9,231,165 B2
(45) Date of Patent: Jan. 5, 2016

(54) LIGHT-EMITTING DIODE CHIP

(71) Applicant: LEXTAR ELECTRONICS CORPORATION, Hsinchu (TW)

(72) Inventors: Wen-Yuan Fan, Taoyuan County (TW); Nai-Wei Hsu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/270,305

(22) Filed: May 5, 2014

(65) Prior Publication Data

US 2015/0187997 A1    Jul. 2, 2015

(30) Foreign Application Priority Data

Dec. 30, 2013  (TW) .............................. 102148950 A

(51) Int. Cl.
*H01L 33/14*     (2010.01)
*H01L 33/42*     (2010.01)
*H01L 33/38*     (2010.01)

(52) U.S. Cl.
CPC .............. *H01L 33/42* (2013.01); *H01L 33/38* (2013.01)

(58) Field of Classification Search
CPC ..................................................... H01L 33/00

USPC ............... 257/79, E33.062, 98, E33.06, 99, 257/E33.005, E33.066; 438/22
See application file for complete search history.

(56) References Cited

U.S. PATENT DOCUMENTS

2010/0187564 A1* 7/2010 Farmer et al. ................. 257/103
2011/0215363 A1* 9/2011 Kimura et al. .................. 257/99

* cited by examiner

*Primary Examiner* — Cuong Q Nguyen
*Assistant Examiner* — Tong-Ho Kim

(57) ABSTRACT

A light-emitting diode (LED) chip is disclosed. The LED chip includes a substrate and a LED stack on the substrate. The LED stack includes a first-type semiconductor layer, an active layer covering a portion and exposing another portion of the first-type semiconductor layer, and a second-type semiconductor layer on the active layer. A current spreading layer is formed on the second-type semiconductor layer. A first electrode is formed on the exposed portion of the first-type semiconductor layer, and a second electrode is formed on the current spreading layer. The current spreading layer includes a first portion having a first thickness and a second portion having a second thickness. A vertical projection of the second portion onto the first-type semiconductor layer surrounds a vertical projection of a portion of the first electrode onto the first-type semiconductor layer. The first thickness is greater than the second thickness.

16 Claims, 8 Drawing Sheets

LIGHT-EMITTING DIODE CHIP

CROSS REFERENCE TO RELATED APPLICATIONS

This application claims priority of Taiwan Patent Application No. 102148950, filed on Dec. 30, 2013, the entirety of which is incorporated by reference herein.

BACKGROUND OF THE INVENTION

1. Field of the Invention

The present disclosure relates to semiconductor technology, and in particular relates to a light-emitting diode (LED) chip that can effectively improve the brightness.

2. Description of the Related Art

Due to advantages such as small size, fast switching speed, low power consumption and good durability, light-emitting diodes (LED) have been involved in various applications, such as lighting, car indicators and traffic signals. A light-emitting diode usually includes a p-n junction constituted of, for example, a p-type semiconductor layer and an n-type semiconductor layer. By an appropriate bias applied to the p-n junction through the electrodes respectively connected to the p-type semiconductor layer and the n-type semiconductor layer, the electrons combine with the holes at the p-n junction. As a result, energy is released and therefore a luminescence phenomenon happens.

In a conventional light-emitting diode manufacturing process, a current-spreading layer is formed on the p-type semiconductor layer such that the current can be uniformly transferred to the p-type semiconductor layer and the p-n junction (i.e., the active layer) connected thereto. In order to further improve the light extraction efficiency (LEE) of the light-emitting diode, it is known that an opening pattern that penetrates through the current-spreading layer may be formed to increase the light emission angle of the light generated by the active layer.

However, since the opening pattern may also result in an obstruction to the current-spreading in the current-spreading layer, the brightness uniformity and the electrical properties (for example, the driving voltage) of such a light-emitting diode needs to be improved. Accordingly, a light-emitting diode chip that can improve the luminous efficiency of light-emitting diodes while maintaining the driving voltage of the light-emitting diodes within a suitable range is still under requirement.

BRIEF SUMMARY OF THE INVENTION

A detailed description is given in the following embodiments with reference to the accompanying drawings.

An embodiment of the present disclosure involves a light-emitting diode chip, comprising a substrate and a light-emitting diode stack formed on the substrate. The light-emitting diode stack includes a first-type semiconductor layer formed on the substrate, an active layer covering a portion of the first-type semiconductor layer and exposing another portion of the first-type semiconductor layer, and a second-type semiconductor layer formed on the active layer. A current-spreading layer is formed on the second-type semiconductor layer. A first electrode is formed on the exposed portion of the first-type semiconductor layer, and a second electrode is formed on the current-spreading layer. The current-spreading layer includes a first portion having a first thickness and a second portion having a second thickness, in which a vertical projection of the second portion onto the first-type semiconductor layer surrounds a vertical projection of a portion of the first electrode onto the first-type semiconductor layer. The first thickness is greater than the second thickness.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

Figure 1:
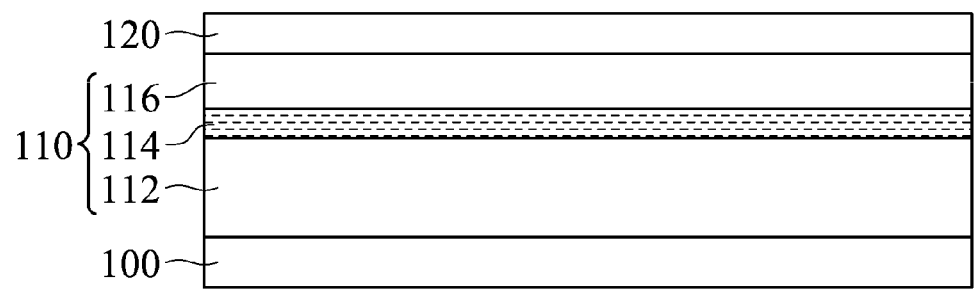
FIGS. 1, 2B, 3B, and 4B are cross-sectional views of a manufacturing process of a light-emitting diode chip according to one embodiment of the present disclosure.

The following description is set forth in order to provide a thorough understanding of the disclosed embodiments. The following description and the drawings are made for the purpose of illustrating the general principles of the disclosure and should not be taken in a limiting sense. The present disclosure may repeat reference numerals and/or letters in the various examples. This repetition is for the purpose of simplicity and clarity and does not in itself dictate a relationship between the various embodiments and/or drawings discussed. The scope of the invention is best determined by reference to the appended claims.

FIGS. 1, 2B, 3B, and 4B are cross-sectional views of a manufacturing process of a light-emitting diode (LED) chip according to one embodiment of the present disclosure.

FIG. 1 illustrates an intermediate step of a manufacturing process of a light-emitting diode chip according to the present disclosure, in which a light-emitting diode stack 110 is formed on the substrate 100. In the present embodiment, the substrate 100 may be a transparent conductive or non-conductive material, such as gallium arsenide (GaAs), sapphire, gallium nitride (GaN), aluminum nitride (AlN), indium nitride (InN), indium phosphide (InP), aluminum gallium nitride (AlGaN), indium gallium nitride (InGaN), silicon carbide (SiC), zinc oxide (ZnO), aluminum-doped zinc oxide (AZO), or a combination thereof. In one embodiment, a sapphire substrate is used as the substrate 100, but it is not limited thereto.

The light-emitting diode stack 110 includes a first-type semiconductor layer 112, an active layer 114 and a second-type semiconductor layer 116 sequentially formed on the substrate 100. The first-type semiconductor layer 112, the active layer 114 and the second-type semiconductor layer 116 may be a single-layer structure or a multilayer structure, respectively. The active layer 114 may have a single heterostructure (SH) structure, a double heterostructure (DH) structure or a multi-quantum well (MQW) structure, and the emission wavelength of the active layer 114 can be adjusted by modifying the composition of the material constituting the active layer 114. For example, an indium gallium nitride/gallium nitride multi-quantum well structure may be used to form the active layer 114 such that the active layer 114 emits a blue light. The first-type semiconductor layer 112, the active layer 114 and the second-type semiconductor layer 116 may include gallium (Ga), aluminum (Al), indium (In), nitrogen (N), arsenic (As), phosphorus (P), silicon (Si), a compound thereof, or a combination thereof, respectively. Moreover, a dopant used to adjust the conductivity of the first-type semiconductor layer 112, the active layer 114 and the second-type semiconductor layer 116 or a dopant used to adjust the electro-optical property of the active layer 114 may be further included therein, respectively. For example, the first-type semiconductor layer 112 may further include an n-type dopant (for example, silicon), and the second-type semiconductor layer 116 may further include a p-type dopant (for example, magnesium). The first-type semiconductor layer 112, the active layer 114 and the second-type semiconductor layer 116 may be formed by any suitable epitaxial growth process, such as a metal-organic chemical vapor deposition (MOCVD) process or a molecular beam epitaxy (MBE) process.

In one embodiment, an n-type doped gallium nitride (n-GaN) layer as the first-type semiconductor layer 112, a multi-quantum well structure as the active layer 114, and a p-type doped gallium nitride (p-GaN) layer as the second-type semiconductor layer 116 are sequentially formed on the substrate 100 by a metal-organic chemical vapor deposition process and a doping process.

Next, a layer of current-spreading material 120 is formed on the second-type semiconductor layer 116 of the light-emitting diode stack 110 such that a laminated structure shown in FIG. 1 is obtained. In one embodiment, the layer of current-spreading material 120 may include a transparent conductive oxide, such as indium tin oxide (ITO), aluminum-doped zinc oxide (AZO), zinc oxide, indium oxide, tin oxide, antimony-doped tin oxide (ATO), or a combination thereof. The layer of current-spreading material 120 may be formed by any suitable method, such as physical or chemical vapor deposition, evaporation, sputtering, or other suitable methods.

Figure 2A:
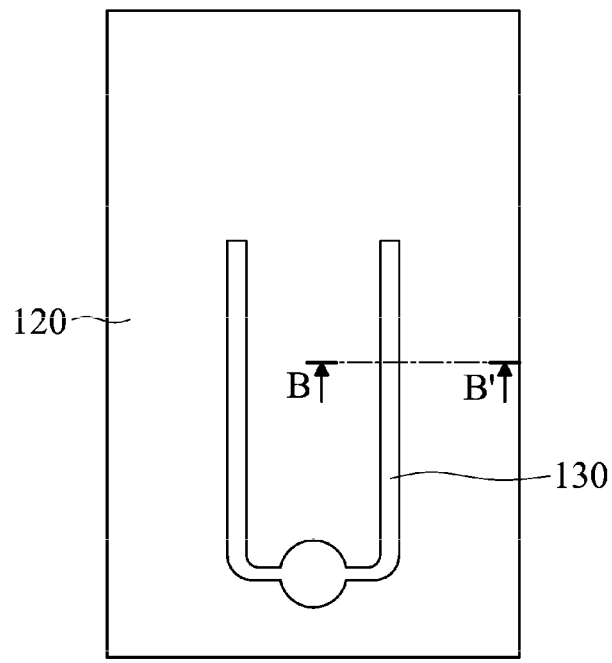
FIGS. 2A, 3A, and 4A are plan views of the manufacturing process of the light-emitting diode chip corresponding to the cross-sectional views shown in FIGS. 2B, 3B, and 4B, respectively.
Figure 2B:
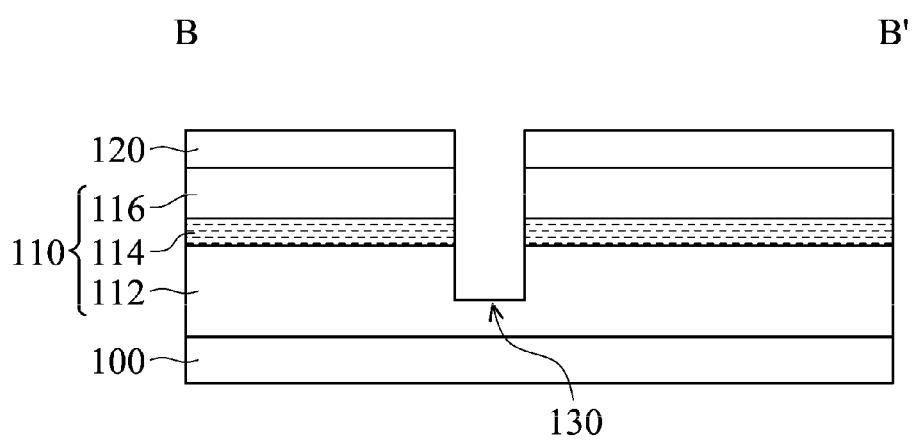
Figure 4A:
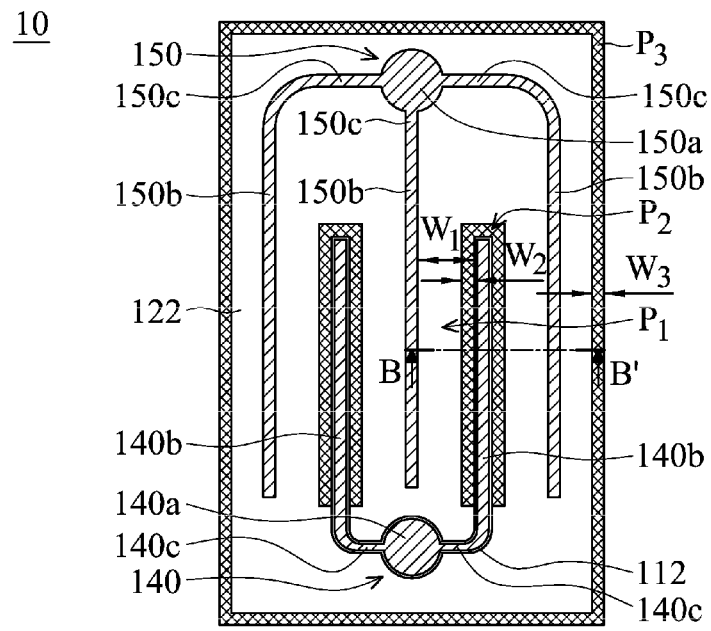
Figure 4B:
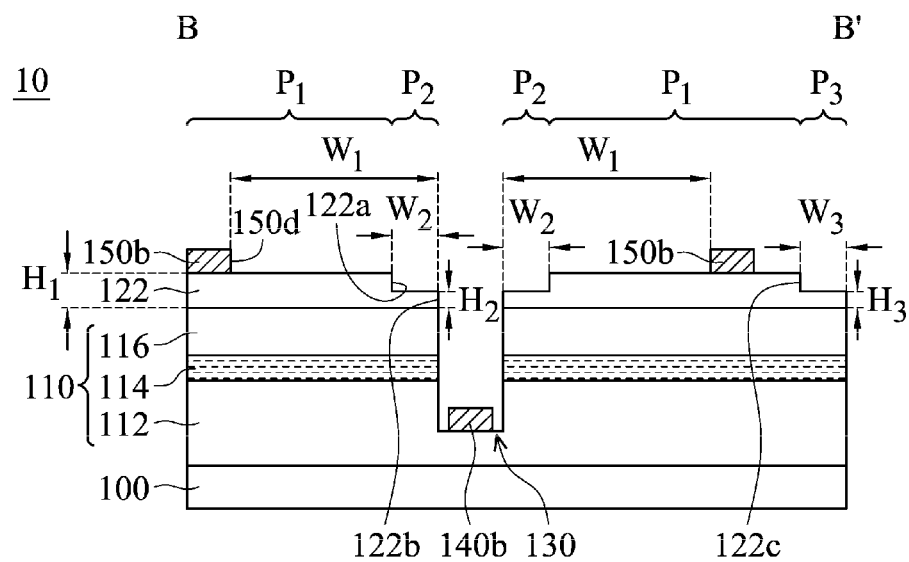

Refer to FIGS. 2A and 2B. FIG. 2A is a plan view of the light-emitting diode chip at an intermediate step of the manufacturing process, in which a mesa region 130 is formed by etching. FIG. 2B is a cross-sectional view along the line B-B' in FIG. 2A. At this step, a mesa etching process is performed on the light-emitting diode stack 110 and the layer of current-spreading material 120 to form a mesa region 130 penetrating through the second-type semiconductor layer 116, the active layer 114 and the first-type semiconductor layer 112. The mesa region 130 may be formed by any suitable method, such as a dry etching process. Refer to FIGS. 2B, 4A and 4B. After the mesa etching process, the active layer 114 covers a portion of the first-type semiconductor layer 112 and exposes another portion of the first-type semiconductor layer 112. The exposed portion of the first-type semiconductor layer 112 (i.e., the mesa region 130) is used to accommodate the first electrode 140 that is formed in the following step (shown in FIGS. 4A and 4B). The first electrode 140 may function as an electrical connection between the first-type semiconductor layer 112 and an external device (not shown). As shown in FIG. 2A, the mesa region 130 defines the region that accommodates the first electrode 140 in the following step, and therefore the mesa region 130 has a shape similar to that of the first electrode 140 as viewed from a top-view perspective of the layer of current-spreading material 120.

Figure 3A:
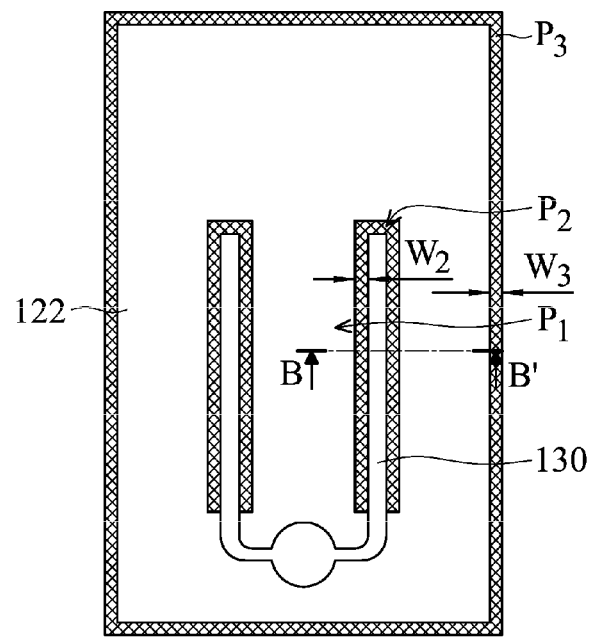
Figure 3B:
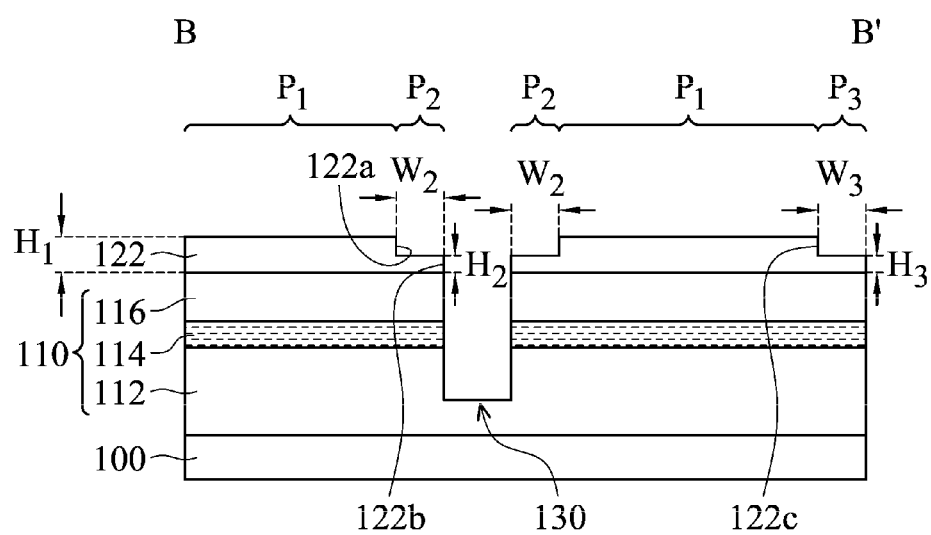

Refer to FIGS. 3A and 3B. FIG. 3A is a plan view of the light-emitting diode chip at an intermediate step of the manufacturing process, in which a current-spreading layer 122 is formed. FIG. 3B is a cross-sectional view along the line B-B' in FIG. 3A. After the mesa region is formed, the layer of current-spreading material 120 is partially removed by lithography and etching processes to form a current-spreading layer 122 including a first portion P1 and a second portion P2. Refer to FIGS. 3A, 4A and 4B, the second portion P2 may be adjacent to the first portion P1, and the second portion P2 may have a shape similar to that of the plurality of first finger electrodes 140b of the first electrode 140 formed in the following step as viewed from a top-view perspective of the current-spreading layer 122. For example, a vertical projection of the second portion P2 onto the first-type semiconductor layer 112 may surround a vertical projection of the plurality of first finger electrodes 140b of the first electrode 140 onto the first-type semiconductor layer 112. The second portion P2 may have a second side 122b opposite to a first side 122a of the first portion P1, and the closest distance between the first side 122a and the second side 122b defines a width W2 of the second portion P2. The width W2 of the second portion P2 may be in a range of 10-80 μm. In one embodiment, the width W2 of the second portion P2 is in a range of 30-60 μm. Refer to FIGS. 3A and 3B. The first portion P1 and the second portion P2 each have a substantially flat surface. The first portion P1 has a first thickness H1, and the second portion P1 has a second thickness H2. The first thickness H1 may be greater than the second thickness H2. In one embodiment, the second thickness H2 is one-fifth to four-fifths of the first thickness H1.

In the present embodiment, the current-spreading layer 122 may further include a third portion P3 adjacent to the first portion P1, and the third portion P3 may be located at an edge of the current-spreading layer 122 as viewed from a top-view perspective of the current-spreading layer 122. The first portion P1 may have a third side 122c adjacent to the third portion P3, and the closest distance between the third side 122c of the first portion P1 and the outer edge of the current-spreading layer 122 defines a width W3 of the third portion P3. Similarly, the width W3 of the third portion P3 may be in a range of 10-80 μm. In one embodiment, the width W3 of the third portion P3 is in a range of 30-60 μm. The third portion P3 has a third thickness H3, and the third thickness H3 may be less than the first thickness H1 of the first portion P1. In one embodiment, the third thickness H3 is one-fifth to four-fifths of the first thickness H1.

Finally, refer to FIGS. 4A and 4B. FIG. 4A is a plan view of the light-emitting diode chip 10 according to the present embodiment, and FIG. 4B is a cross-sectional view along the line B-B' in FIG. 4A. After the current-spreading layer 122 is formed, a first electrode 140 is formed on the mesa region 130 and a second electrode 150 is formed on the current-spreading layer 122 such that the light-emitting diode chip 10 of the present embodiment is obtained. In the present embodiment, the first electrode 140 includes a first main portion 140a, a plurality of first finger electrodes 140b, and a plurality of first electrode connecting portions 140c corresponding to the plurality of first finger electrodes 140b. Each first finger electrode 140b is connected to the first main portion 140a by one of the plurality of the first electrode connecting portions 140c. The second electrode 150 includes a second main portion 150a, a plurality of second finger electrodes 150b, and a plurality of second electrode connecting portions 150c. Each second finger electrode 150b is connected to the second main portion 150a by one of the plurality of the second electrode connecting portions 150c. Moreover, each first finger electrode 140b is disposed between two adjacent second finger electrodes 150b, as shown in FIG. 4A. The first electrode 140 and the second electrode 150 may include a conductive material, such as copper (Cu), aluminum (Al), silver (Ag), gold (Au) or a combination thereof. The first electrode 140 and the second electrode 150 may be formed by any suitable method, such as physical or chemical vapor deposition, evaporation, sputtering, electroplating, or other suitable methods.

Figure 5:
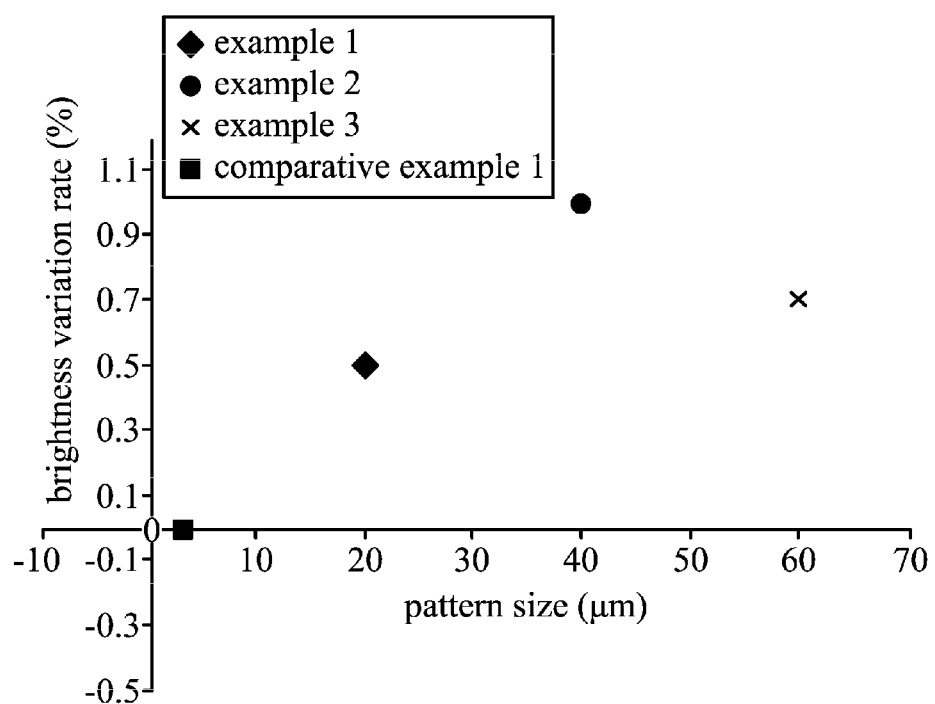
FIG. 5 is a measured result of brightness variation rate according to exemplary embodiments of the present disclosure.
Figure 6:
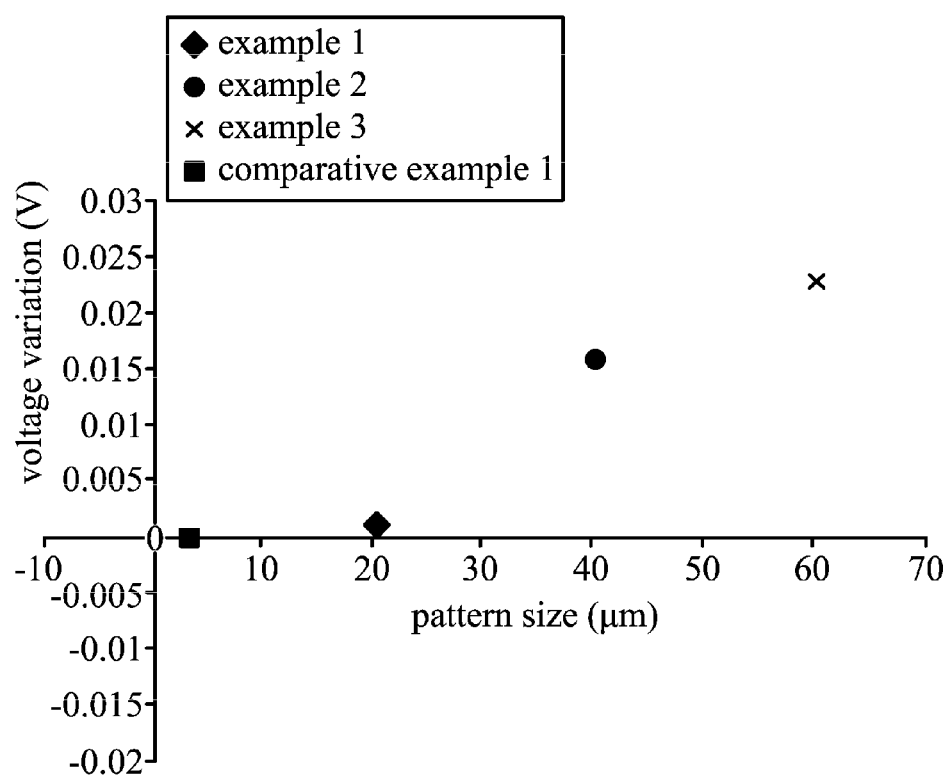
FIG. 6 is a measured result of voltage variation according to exemplary embodiments of the present disclosure.

Refer to FIGS. 5 and 6, which shows the measured results of the brightness and the driving voltage ($V_F$) of examples 1-3 (in which the width W2 of the second portion P2 and the width W3 of the third portion P3 of the current-spreading layer is 20, 40, 60 μm, respectively) and comparative example 1 (in which an opening pattern penetrating through the current-spreading layer). Taking the brightness value of a device without any pattern or thickness variation formed in the current-spreading layer as a reference, FIG. 5 shows a brightness variation rate (%) obtained by calculating the difference in percentage between the measured brightness values of examples 1-3 and comparative example 1 and the measured brightness value of the device without any pattern or thickness variation formed in the current-spreading layer. Moreover, FIG. 6 shows a driving voltage variation (V) obtained by calculating the difference in percentage between the measured driving voltage values of examples 1-3 and comparative example 1 and the measured driving voltage value of a device without any pattern or thickness variation formed in the current-spreading layer. In FIGS. 5 and 6, the width W2 of the second portion P2 and the width W3 of the third portion P3 are defined as the pattern size.

As shown in FIG. 5, the brightness value of comparative example 1 has no significant improvement. Compared to this, the brightness values of the light-emitting diode chips of examples 1-3 provided by the present embodiment are significantly improved by 0.5-1.1%, respectively. Though the driving voltage values of the light-emitting diode chips of examples 1-3 provided by the present embodiment are slightly higher than that of comparative example 1 in the measured results of the driving voltage variation shown in FIG. 6, however, if the brightness performance of the light-emitting diode chips shown in FIG. 5 are taken into consideration, the overall performance of the light-emitting diode chips of examples 1-3 provided by the present embodiment are still superior to that of comparative example 1. Particularly, in example 1 of the present embodiment (W2=W3=20 μm), the brightness value of the light-emitting diode is improved by 0.5%, while its driving voltage variation is less than 0.005V. Accordingly, it is known that since the second portion P2, of which the vertical projection onto the first-type semiconductor layer 112 surrounds the vertical projection of the first electrode 140 onto the first-type semiconductor layer 112, and the third portion P3, which is formed at the edge of the current-spreading layer 122, are formed in the current-spreading layer 122 of the light-emitting diode chip provided by the present disclosure, the light absorption of the current-spreading layer 122 is decreased and the light extraction efficiency is improved, while the current-spreading efficiency of the current-spreading layer 122 is maintained within a suitable range. Therefore, the brightness and the luminous efficiency of the light-emitting diode chip 10 are improved.

Figure 7:
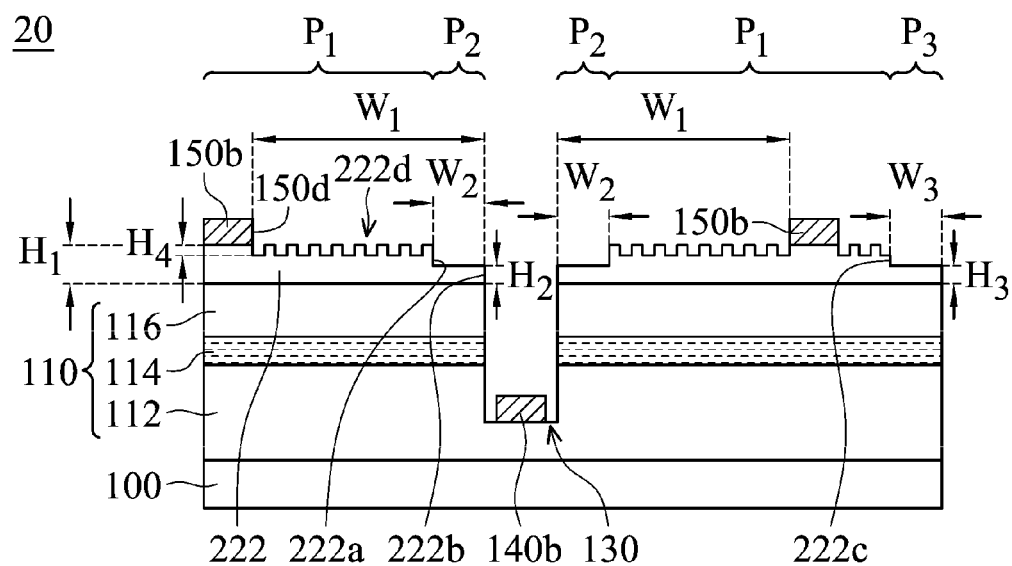
FIG. 7 is a cross-sectional view of a light-emitting diode chip according to another embodiment of the present disclosure.

FIG. 7 is a cross-sectional view of a light-emitting diode chip 20 according to another embodiment of the present disclosure. In this embodiment, after the light-emitting diode stack 110 is formed, a current-spreading layer 222 including at least one recess 222d in addition to the first portion P1, the second portion P2 and the third portion P3 on the second-type semiconductor layer 116 of the light-emitting diode stack 110 may be formed. Then, a first electrode 140 on the mesa region 130 and a second electrode 150 on the current-spreading layer 150 are respectively formed by a process similar to the process in the embodiment shown in FIG. 4A, such that a light-emitting diode chip 20 according to the present embodiment is obtained. The at least one recess 222d is located on the upper surface of the first portion P1 of the current-spreading layer 222. The at least one recess 222d has a depth H4 less than or equal to the second thickness H2 of the second portion P2. Due to the existence of the at least one recess 222d on the upper surface of the first portion P1, the light emission angle of the light emitted from the active layer 114 of the light-emitting diode chip 20 can be increased. Therefore, the light emission efficiency and the brightness of the light-emitting diode chip 20 can be further improved. Moreover, since the at least one recess 222d provided by this embodiment does not penetrate through the current-spreading layer 222, the current-spreading efficiency of the current-spreading layer 222 can be maintained within a suitable range while the brightness of the light-emitting diode chip 20 is improved.

Figure 8A:
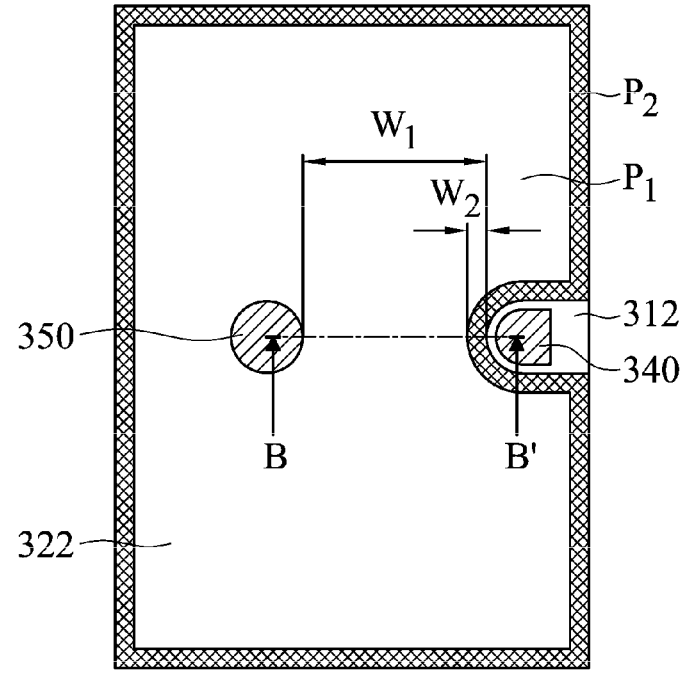
FIGS. 8A and 8B are a plan view and a cross-sectional view of a light-emitting diode chip, respectively, according to yet another embodiment of the present disclosure.
Figure 8B:
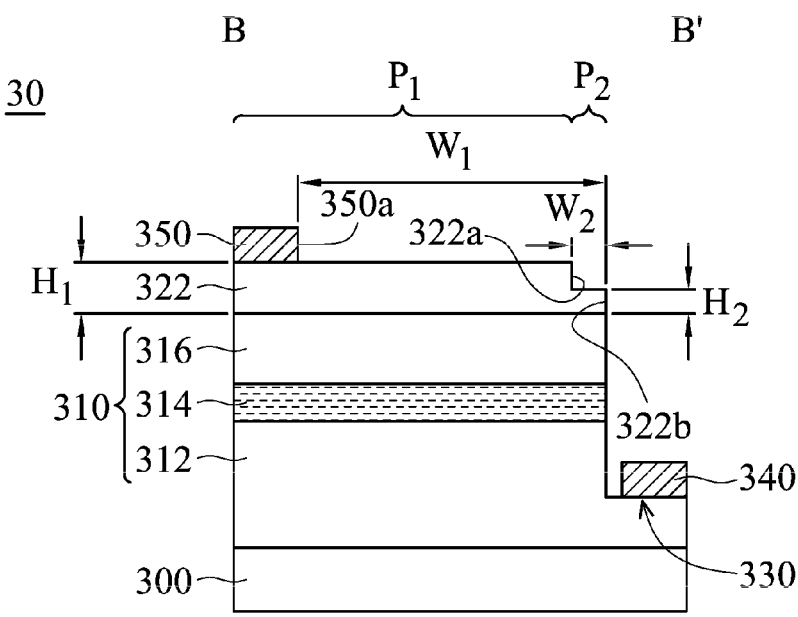

FIGS. 8A and 8B are a plan view and a cross-sectional view of a light-emitting diode chip 30, respectively, according to yet another embodiment of the present disclosure. In this embodiment, a first electrode 340 may be formed without a plurality of first finger electrodes and a plurality of first electrode connecting portions. A second electrode 350 may be formed without a plurality of second finger electrodes and a plurality of second electrode connecting portions. A current-spreading layer 322 having a second portion P2 at the edge may be formed on a second-type semiconductor layer 316 of a light-emitting diode stack 310, such that a light-emitting diode chip 30 of this embodiment is obtained. Similarly, the first thickness H1 of the first portion P1 may be greater than the second thickness H2 of the second portion P2. In one embodiment, the second thickness H2 is one-fifth to four-fifths of the first thickness H1. The width W2 of the second portion P2 may be in a range of 10-80 μm. In one embodiment, the width W2 of the second portion P2 is in a range of 30-60 μm. Since the first electrode 340 and the second electrode 350 in the light-emitting diode chip 30 of this embodiment have smaller areas, the light-emitting diode chip 30 can be involved in a small-sized light-emitting diode chip to improve the brightness, while the driving voltage is maintained in a suitable range.

In addition, the light-emitting diode chips 10, 20, 30 provided by the above embodiments of the present disclosure may be further involved in the manufacturing of illuminating appliances, such as solid-state lighting devices, backlight units of liquid-crystal displays, indicators, and light sensors.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A light-emitting diode chip, comprising:
   a substrate;
   a light-emitting diode stack formed on the substrate, wherein the light-emitting diode stack includes:
      a first-type semiconductor layer formed on the substrate;

an active layer covering a portion of the first-type semiconductor layer and exposing another portion of the first-type semiconductor layer; and a second-type semiconductor layer formed on the active layer;

a current-spreading layer formed on the second-type semiconductor layer;

a first electrode formed on the exposed portion of the first-type semiconductor layer; and a second electrode formed on the current-spreading layer; wherein the current-spreading layer includes:

a first portion having a first thickness, wherein the second electrode is directly above and contacts a top surface of the first portion; and a second portion having a second thickness, wherein a vertical projection of the second portion onto the first-type semiconductor layer surrounds a vertical projection of a portion of the first electrode onto the first-type semiconductor layer;

wherein the first thickness is greater than the second thickness.

2. The light-emitting diode chip as claimed in claim 1, wherein the first electrode includes a first main portion, a plurality of first finger electrodes and a plurality of first electrode connecting portions, and each first finger electrode is connected to the first main portion by one of the plurality of first electrode connecting portions.

3. The light-emitting diode chip as claimed in claim 2, wherein the second electrode includes a second main portion, a plurality of second finger electrodes and a plurality of second electrode connecting portions, each second finger electrode is connected to the second main portion by one of the plurality of second electrode connecting portions, and each first finger electrode is disposed between two adjacent second finger electrodes.

4. The light-emitting diode chip as claimed in claim 3, wherein the vertical projection of the second portion onto the first-type semiconductor layer surrounds a vertical projection of the plurality of first finger electrodes onto the first-type semiconductor layer.

5. The light-emitting diode chip as claimed in claim 1, wherein the second thickness is one-fifth to four-fifths of the first thickness.

6. The light-emitting diode chip as claimed in claim 1, wherein the current-spreading layer further includes a third portion at an edge of the current-spreading layer, wherein the third portion has a third thickness less than the first thickness of the first portion.

7. The light-emitting diode chip as claimed in claim 6, wherein the third thickness is one-fifth to four-fifths of the first thickness.

8. The light-emitting diode chip as claimed in claim 1, wherein a width of the second portion is in a range of 10-80 μm.

9. The light-emitting diode chip as claimed in claim 8, wherein a width of the second portion is in a range of thirty to 30-60 μm.

10. The light-emitting diode chip as claimed in claim 6, wherein a width of the third portion is in a range of 10-80 μm.

11. The light-emitting diode chip as claimed in claim 10, wherein a width of the third portion is in a range of 30-60 μm.

12. The light-emitting diode chip as claimed in claim 1, wherein the first portion has a substantially flat surface.

13. The light-emitting diode chip as claimed in claim 1, wherein a top surface of the first portion includes at least one recess, and wherein a depth of the recess is less than or equal to the second thickness.

14. The light-emitting diode chip as claimed in claim 1, wherein a material of the current-spreading layer comprises a transparent conductive oxide.

15. The light-emitting diode chip as claimed in claim 1, wherein a vertical projection of the first portion onto the first-type semiconductor layer is greater than the vertical projection of the second portion onto the first-type semiconductor layer.

16. The light-emitting diode chip as claimed in claim 6, wherein the third portion is fully separated from the second portion by the first portion.

* * * * *